(12) United States Patent
Bhattacharya et al.

(10) Patent No.: US 6,184,765 B1
(45) Date of Patent: Feb. 6, 2001

(54) SWITCH USEFUL AT SUPERCONDUCTING TEMPERATURES AND COMPRISING SUPERCONDUCTING MATERIAL

(75) Inventors: Sabyasachi Bhattacharya, New York, NY (US); Mark J. Higgins, Cranbury, NJ (US); Satyajit S. Banerjee, Mumbai (IN); Nitin Patil, Mumbai (IN); Srinivasan Ramakrishnan, Mumbai (IN); Arun K. Grover, Mumbai (IN); Chandrasekhar V.R. Turumella, Mumbai (IN); Vinod C. Sahni, Mumbai (IN); Gurazada Ravikumar, Mumbai (IN); Prashant K. Mishra, Mumbai (IN)

(73) Assignees: NEC Research Institute, Inc., Princeton, NJ (US); Tata Institute of Fundamental Research; TPPED (Technical Pyhsics & Prototype Engineering Division), both of Mumbai (IN)

( * ) Notice: Under 35 U.S.C. 154(b), the term of this patent shall be extended for 0 days.

(21) Appl. No.: 09/226,299

(22) Filed: Jan. 7, 1999

(51) Int. Cl.[7] ................................................. H01F 6/00
(52) U.S. Cl. .................................... 335/216; 505/860
(58) Field of Search ........................... 335/216; 505/860, 505/861; 174/15.4, 125.1

(56) References Cited

U.S. PATENT DOCUMENTS

| | | | |
|---|---|---|---|
| 4,326,188 | * 4/1982 | Dahlberg | 338/32 S |
| 4,419,125 | * 12/1983 | Charles et al. | 29/599 |
| 4,575,927 | * 3/1986 | Braginski et al. | 29/599 |
| 5,153,803 | * 10/1992 | Repeaux et al. | 361/19 |
| 5,323,344 | * 6/1994 | Katayama et al. | 365/162 |
| 5,679,624 | * 10/1997 | Das | 505/701 |
| 5,747,425 | * 5/1998 | Xin et al. | 338/32 S |

* cited by examiner

Primary Examiner—Lincoln Donovan
(74) Attorney, Agent, or Firm—Scully, Scott, Murphy & Presser

(57) ABSTRACT

The present invention is directed, inter alia, to a switch comprising:

(A) a superconducting material whose field cooled and zero field cooled ac permittivities differ from each other, and whose field cooled and zero field cooled ac susceptibilities differ from each other, in a range of temperature below the superconducting transition temperature of the material;

(B) means for applying a static magnetic field to said material;

(C) means for controllably applying to said material an oscillating magnetic field of a magnitude effective to convert said material from a state exhibiting filed cooled permittivity to a state exhibiting zero field cooled permittivity; and (D) means for applying to said material a heat pulse effective to convert said material from a state exhibiting zero field cooled permittivity to a state exhibiting field cooled permittivity, said switch operating between a superconducting zero field cooled state and a superconducting field cooled state.

The present invention is also directed, inter alia, to a method of making such a switch.

6 Claims, 2 Drawing Sheets

SWITCH USEFUL AT SUPERCONDUCTING TEMPERATURES AND COMPRISING SUPERCONDUCTING MATERIAL

The present invention relates to the field of superconductors, i.e. materials which below a characteristic critical temperature exhibit no resistance to electrical current. More particularly, the present invention relates to superconducting materials exhibiting history-dependent magnetic permittivity, and to switch devices that incorporate such materials.

The maximum current-carrying capacity (or "critical current density") of a superconducting material above which at a given temperature it becomes resistive to current flow is also a characteristic of the material. As distinguished from superconducting materials found to have ever higher critical temperatures and even higher critical current densities, the present invention utilizes superconducting materials characterized in that the critical current density can be either of two values, at a given temperature in a magnetic field of given strength. The discovery that the critical current density of such materials can be controllably and reversibly switched, and the discovery of how to achieve such controllability and reversible switching, are significant attributes of the present invention.

BRIEF SUMMARY OF THE INVENTION

One aspect of the present invention is a switch comprising
(A) a superconducting material whose field cooled and zero field cooled ac permittivities differ from each other, and whose field cooled and zero field cooled ac susceptibilities differ from each other, in a range of temperature below the superconducting transition temperature of the material;
(B) means for applying a static magnetic field to said material;
(C) means for controllably applying to said material an oscillating magnetic field of a magnitude effective to convert said material from a state exhibiting field cooled permittivity to a state exhibiting zero field cooled permittivity; and
(D) means for applying to said material a heat pulse effective to convert said material from a state exhibiting zero field cooled permittivity to a state exhibiting field cooled permittivity.

Another aspect of the present invention is a method of making a switch, comprising
(a) providing a superconducting material which exhibits field cooled and zero field cooled ac permittivities and ac susceptibilities which differ from each other in a range of temperature below the superconducting transition temperature of the material;
(b) providing a source of a static magnetic field acting on said material;
(c) providing means for controllably applying to said material an oscillating magnetic field of a magnitude effective to convert said material from a state exhibiting field cooled permittivity to a state exhibiting zero field cooled permittivity; and
(d) providing means for controllably applying to said material a heat pulse effective to convert said material from a state exhibiting zero field cooled permittivity to a state exhibiting field cooled permittivity.

Yet another aspect of the present invention is a method of increasing the critical current density of a superconducting material which exhibits field cooled and zero field cooled ac permittivities and ac susceptibilities which differ from each other in a range of temperature below the superconducting transition temperature of material, comprising applying to said material, while it is in a static magnetic field at a temperature in said range and while it is in a state exhibiting zero field cooled permittivity, a heat pulse effective to convert said material to a state exhibiting field cooled permittivity.

Another aspect of the present invention is a method of decreasing the critical current density of a superconducting material which exhibits field cooled and zero field cooled ac permittivities and ac susceptibilities which differ from each other in a range of temperature below the superconducting transition temperature of the material, comprising applying to said material, while it is in a static magnetic field at a temperature in said range and while it is in a state exhibiting field cooled permittivity, an oscillating magnetic field of a magnitude effective to convert said material to a state exhibiting zero field cooled permittivity.

DETAILED DESCRIPTION OF THE INVENTION

The present invention has utility in any application in which superconductors are used in motors and the like and it is desirable to be able to control, i.e. switch, the system from an unresistive state to a state exhibiting resistance. One example is in magnetic-levitation trains.

This invention has applicability to any superconductor material in which, in a range of temperature below the material's superconducting transition temperature, the field cooled and zero field cooled ac permittivities differ from each other, and the field cooled and zero field cooled ac susceptibilities differ from each other. By "field cooled" is meant that the material is subjected to a magnetic field as it is cooled to the given temperature below the superconducting transition temperature. By "zero field cooled" is meant that the material is not subjected to a magnetic field as it is cooled to the given temperature below the superconducting transition temperature and the magnetic field is applied after the said temperature is attained.

Figure 1:
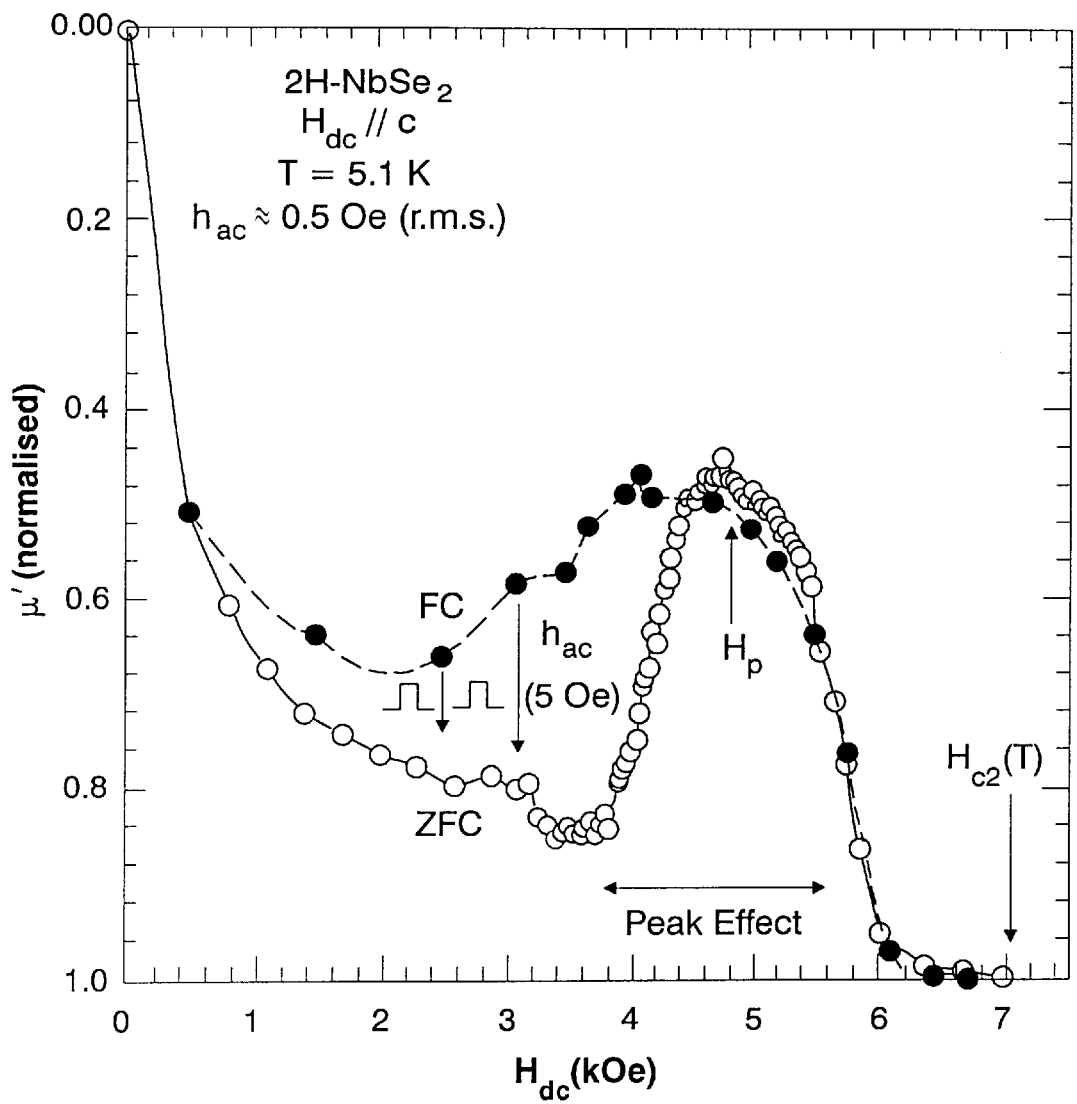
FIG. 1 is a graph of isothermal permittivity for samples of the superconductor $2H-NbSe_2$.

It is preferable to have some detectable difference in ac permittivity, and in ac susceptibility, between the zero field cooled and field cooled states. More preferably, the difference should be at least 0.10 in normalized units. FIG. 1 shows that as long as the magnetic field does not penetrate a superconductor, the permittivity is zero, whereas in the normal state ($H \geq H_{c2}$), the permittivity is one, as the field penetrates uniformly.

Materials which exhibit the desired difference in ac permittivity and in ac susceptibility can be identified by magnetization studies in which the magnetization response as a function of magnetic field (at constant temperature) or as a function of temperature (at constant field) is measured for pairs of states prepared under field cooled and zero field cooled conditions.

One preferred material useful in this invention is hexagonal $NbSe_2$. Other useful superconductor materials would include weakly pinned superconducting samples of all varieties of superconductors, e.g. pure elements like Nb, A15 systems like $V_3Si$, intermetallic compounds like $CeRu_2$, stannides like $Ca_3Rh_4Sn_3$, quaternary borocarbides like $YNi_2B_2C$, and high-$T_c$ cuprates like $YBa_2Cu_3O_{7\delta}$.

Preferably the superconductor material includes a dopant. Suitable dopant materials, and useful effective amounts thereof, can be identified by observation of their effect when a superconductor material containing a given amount of a given dopant is subjected to magnetization studies as mentioned above. Examples of effective dopants would include elements such as Ta, for Nb in $NbSe_2$ and magnetic impurities such as Fe.

Typically, amounts of dopants range from a few ppm to 100–200 ppm, rarely up to 300–400 ppm. It should be recognized that intentional introduction of dopant material into a superconductor material is not always necessary, because trace impurities which become incorporated in the superconductor during its formation and/or purification can provide adequate doping to the material.

Figure 2:
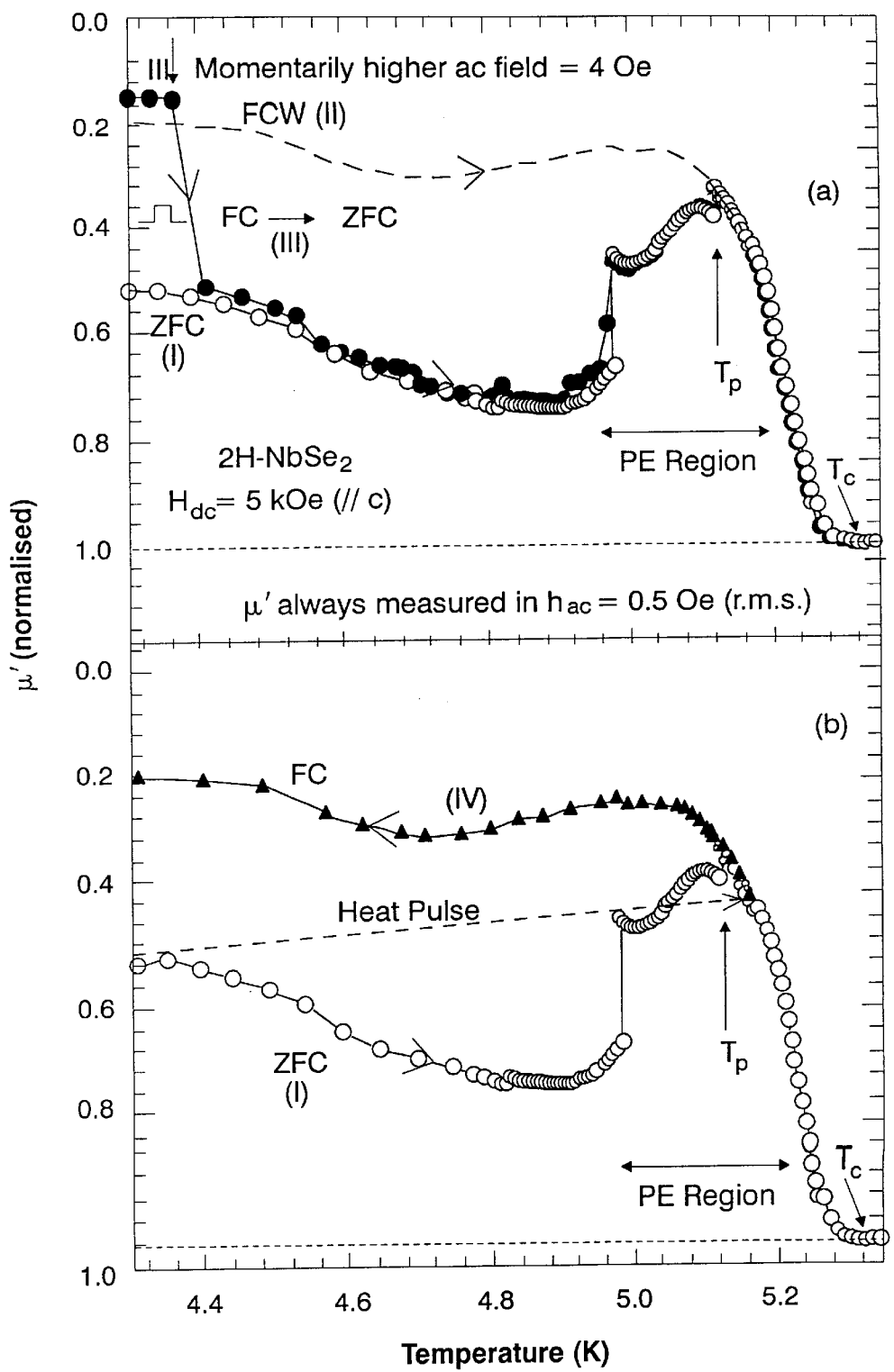
FIG. 2 is a graph of isofield permittivity for the superconductor $2H-NbSe_2$.

A weakly pinned superconductor is suitable for a switching device such as the present invention at a given field if it displays a pronounced peak effect in temperature dependent measurements of the critical current in the ZFC state and a much less pronounced one in the FC state (as is shown in FIG. 2).

The ability of superconductor materials, meeting these criteria, to be switched between states, is also demonstrated by magnetization studies, as will be seen in the following example. This example illustrates the invention with $NbSe_2$ but the invention should not be construed as being limited to that material.

EXAMPLE

The ac permeability $\mu'$ (H,T) ($=B/H=1+\chi'$) was measured using a home built ac susceptometer and the dc magnetization (M(H,T)) was measured using a standard Quantum Design Inc. SQUID magnetometer (MPMS). The platelet-shaped single crystal sample of hexagonal 2H-$NbSe_2$ had dimensions 2×1.5×0.3 $mm^3$ and zero field superconducting transition temperature $T_c(0) \approx 6$ K. The dc field ($H_{dc}$) was applied parallel to the c-axis. In the ac magnetization studies, the ac field ($h_{ac}$) was also along the c-axis. Though most ac magnetization measurements were made at 211 Hz, the observed behavior reported was independent of the frequency in the range $10-10^3$ Hz.

FIG. 1 presents the $\mu'$ (H) measured at a constant temperature of 5.1 K for a sample that was prepared in the zero field cooled (ZFC) state (i.e. dc field applied after cooling the sample to 5.1 K in zero field) and also for samples which were prepared in the field cooled (FC) mode (i.e., field applied at $T>T_c(0)$). The information about the field dependence of $J_c$ can be extracted from the $\mu'$ data of FIG. 1 from known equations wherein $\mu'$ varies inversely with $J_c$. FIG. 1 shows that so long as magnetic flux does not penetrate a superconductor, $\mu'=0$, whereas in the normal state $\mu'=1$, as the external field penetrates uniformly. As the field penetrates the superconductor above its lower critical field $H_{c1}$, $\mu'$ starts to increase from zero in accordance with the manner in which $J_c(H)$ usually decreases with H. However in FIG. 1, the $\mu'$ curves for both ZFC and FC modes show an anomalous peak at $H=H_p$, illustrating the existence of the well known Peak Effect in $J_c$ vs H below $H_{c2}$, above which the system becomes normal. FIG. 1 further shows that $\mu'$ (H) values in the FC mode are smaller than those in the ZFC mode in the field interval 1kOe<H<$H_p$.

The $\mu'$ values in FIG. 1 were obtained with $h_{ac}$ of 0.5 Oe (r.m.s.). If the vortex state produced in the FC mode is momentarily subjected to a larger $h_{ac}$ of about 5 Oe (r.m.s.), the values are seen to have switched over to the corresponding values of the ZFC state. This transformation process from FC to ZFC mode is illustrated by arrows in FIG. 1.

FIGS. 2(a) and 2(b) show the temperature evolution of the $\mu'$ response, for samples prepared in the ZFC (o) and FC ( - - - ) modes at $H_{dc}$=5 kOe (approximately the peak field value at 5.1 K in FIG. 1). In FIG. 2(a), the sample was first cooled to 4.2 K in zero field and a dc field of 5 kOe was then applied and magnetic shielding response measured in $h_{ac}$ of 0.5 Oe (r.m.s.) while warming up to the normal state (ZFC o). In the second cycle (II), the crystal was cooled down to 4.2 K in the same dc field and the ac response was measured with $h_{ac}$ of 0.5 Oe (r.m.s.) while warming—up (FCW - - - ) to the normal state. In the third cycle (III), the specimen was cooled down in a field to 4.2 K and the ac response was measured in $h_{ac}$ of 0.5 Oe up to 4.35 K. At 4.35 K, $h_{ac}$ was momentarily increased to a value of about 4 Oe (r.m.s.) and ac response measurements were carried out once again in $h_{ac}$ of 0.5 Oe (r.m.s.) while warming up to the normal state (FC→ZFC).

The following features are noteworthy in FIG. 2(a). First, it can be seen that $J_c^{FC} > J_c^{ZFC}$ (from known equations) for $T<T_p$, where $T_p$ ($\approx$5.1 K) identifies the peak temperature in $H_{dc}$=5 kOe, consistent with $H_p(T)$ data in FIG. 1. The difference between $J_c^{ZFC}$ and $J_c^{ZFC}$ vanishes at the peak position of the Peak Effect, both in the isothermal and isofield measurements. Second, the FC sample in a field of 5 kOe transforms to an ordered ZFC like state with a small ac driving force of 4 Oe (r.m.s.). Such a transformation cannot be reversed by either warming the sample up to the Peak Effect region or cooling it down towards 0 K. Third, it appears that there exists a threshold value of $h_{ac}$, up to which the disordered FC state does not show any sign of transforming (on the time scale of duration of this experiment, i.e., several hours) towards the more ordered ZFC like state. For example, in the temperature interval 4.2 K to 4.8 K, an application of $h_{ac}$ of less than 2.75 Oe (r.m.s.) to the FC state did not produce any change in its $\mu'$ value. The existence of such a threshold height of an ac pulse implies that a finite energy barrier separates the FC state from the ZFC state; only when this barrier is overcome by the threshold ac amplitude, does the system transform from the FC state to the ZFC state.

FIG. 2(b) illustrates how to transform the sample from the ZFC like state to the FC state. Subjecting a ZFC lattice to a heat pulse such that the specimen temperature momentarily exceeds the superconducting transition temperature $T_c(H)$, cools the sample down in field and the resulting state would be a FC state. To further explore this fact, a sample prepared in ZFC mode was subjected to cool down cycles from different chosen temperatures lying below the $T_c(H)$. The results of these tests showed that if a ZFC state is cooled down from a temperature below the onset temperature of PE, the cool down $\mu'$ (T) curve retraces its warm-up path. However, if a cool down cycle is initiated from a temperature in the PE region, the cool down curve does not reach the ZFC $\mu'$ (T) curve, but instead overlaps with the FC like $\mu'$ (T) curve. This is illustrated in FIG. 2(b) by the solid triangle data points recorded while cooling down from a temperature value lying between $T_p(H)$ and $T_c(H)$ Thus, if a heat pulse is applied to a sample in the ZFC state at $T<<T_c(H)$ such that the sample temperature momentarily enters the PE region, the sample would eventually cool down to a FC state (at $T<<T_c(H)$). An ac field $h_{ac}$ of amplitude $\geq 4$ Oe (r.m.s.) would then transform the FC state to the ZFC state (at $T<<T_c(H)$ i.e., without any change in sample temperature).

The $\mu'$ (T) values of FC and ZFC differ significantly so the transformation from ZFC to FC state via a heat pulse and changeover back to a ZFC like state with an ac pulse in a predictive manner has the characteristics of a binary device. The sample after a heat pulse will always be in the disordered FC state with smaller $\mu'$ (or larger diamagnetic $\chi'$) value.

The above results demonstrate that metastable states with widely different bulk magnetic screening response can be obtained in the vortex state of a type-II superconductor. The two different history-dependent states discussed here, i.e., the FC and ZFC state, provide an example of a two-state system. The two states are robust against thermal fluctuations. Furthermore, the system can be switched predictably from one state to the other, through the use of a small ac or dc field in one case or by a heat-pulse in the other. Thus, the invention is useful as a binary device which can be used, for example, as a magnetic memory cell.

The heat pulse can be provided in ways such as pulsing a high current for 10 to 100 milliseconds through a resistance heater wound on the superconductor; or exposing the sample to the light of a laser diode mounted on top of the sample for a few seconds.

What is claimed is:

1. A switch comprising:
   (A) a superconducting material whose field cooled and zero field cooled ac permittivities differ from each other, and whose field cooled and zero field cooled ac susceptibilities differ from each other, in a range of temperature below the superconducting transition temperature of the material;
   (B) means for applying a static magnetic field to said material;
   (C) means for controllably applying to said material an oscillating magnetic field of a magnitude effective to convert said material from a state exhibiting filed cooled permittivity to a state exhibiting zero field cooled permittivity; and
   (D) means for applying to said material a heat pulse effective to convert said material from a state exhibiting zero field cooled permittivity to a state exhibiting field cooled permittivity, said switch operating between a superconducting zero field cooled state and a superconducting field cooled state.

2. A switch according to claim 1 wherein said superconducting material comprises hexagonal $NbSe_2$.

3. A method of making a switch, comprising
   (a) providing a superconducting material which exhibits field cooled and zero field cooled ac permittivities and ac susceptibilities which differ from each other in a range of temperature below the superconducting transition temperature of the material;
   (b) providing a source of a static magnetic field acting on said material;
   (c) providing means for controllably applying to said material an oscillating magnetic field of a magnitude effective to convert said material from a state exhibiting field cooled permittivity to a state exhibiting zero field cooled permittivity; and
   (d) providing means for controllably applying to said material a heat pulse effective to convert said material from a state exhibiting zero field cooled permittivity to a state exhibiting field cooled permittivity, said switch operating between a superconducting zero field cooled state and a superconducting field cooled state.

4. A method according to claim 3 wherein said superconducting material comprises hexagonal $NbSe_2$.

5. A method of decreasing the critical current density of a superconducting material which exhibits field cooled and zero field cooled ac permittivities and ac susceptibilities which differ from each other in a range of temperature below the superconducting transition temperature of the material, comprising applying to said material, while it is in a static magnetic field at a temperature in said range and while it is in a state exhibiting field cooled permittivity, an oscillating magnetic field of a magnitude effective to convert said material to a state exhibiting zero field cooled permittivity.

6. A method according to claim 5 wherein said superconducting material comprises hexagonal $NbSe_2$.

* * * * *